US008947919B2

(12) United States Patent
Ranjan et al.

(10) Patent No.: US 8,947,919 B2
(45) Date of Patent: Feb. 3, 2015

(54) HIGH CAPACITY LOW COST MULTI-STACKED CROSS-LINE MAGNETIC MEMORY

(71) Applicant: Avalanche Technology, Inc., Fremont, CA (US)

(72) Inventors: Rajiv Yadav Ranjan, San Jose, CA (US); Parviz Keshtbod, Los Altos Hills, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 14/017,255

(22) Filed: Sep. 3, 2013

(65) Prior Publication Data

US 2014/0011296 A1     Jan. 9, 2014

Related U.S. Application Data

(63) Continuation of application No. 11/740,861, filed on Apr. 26, 2007, now abandoned, and a continuation-in-part of application No. 11/674,124, filed on Feb. 12, 2007, now Pat. No. 8,084,835, and a continuation-in-part of application No. 11/678,515, filed on Feb. 23, 2007, now Pat. No. 8,058,696, and a continuation-in-part of application No. 11/739,648, filed on Apr. 24, 2007, now Pat. No. 8,183,652.

(60) Provisional application No. 60/795,755, filed on Apr. 27, 2006.

(51) Int. Cl.
  *G11C 11/00*   (2006.01)
  *H01L 27/22*   (2006.01)
  *G11C 11/16*   (2006.01)

(52) U.S. Cl.
  CPC ............ *H01L 27/224* (2013.01); *G11C 11/16* (2013.01); *Y10S 977/933* (2013.01); *Y10S 977/935* (2013.01)
  USPC ........... 365/158; 365/148; 365/171; 977/933; 977/935

(58) Field of Classification Search
  CPC ..................................................... G11C 11/00
  USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
  See application file for complete search history.

(56) References Cited

U.S. PATENT DOCUMENTS

| | | | |
|---|---|---|---|
| 2002/0001223 A1* | 1/2002 | Saito et al. | 365/158 |
| 2002/0048128 A1* | 4/2002 | Kamiguchi et al. | 360/324.1 |
| 2002/0141231 A1* | 10/2002 | Komori | 365/158 |
| 2004/0208053 A1* | 10/2004 | Hayakawa | 365/158 |
| 2007/0279978 A1* | 12/2007 | Ho et al. | 365/173 |

* cited by examiner

*Primary Examiner* — Harry W Byrne
(74) *Attorney, Agent, or Firm* — Maryam Imam; IPxLaw Group LLP (57) ABSTRACT

One embodiment of the present invention includes a diode-addressable current-induced magnetization switching (CIMS) memory element including a magnetic tunnel junction (MTJ) and a diode formed on top of the MTJ for addressing the MTJ.

9 Claims, 11 Drawing Sheets

Amorphous → Micro-crystalline → Single-crystalline

| Cell size: N=1 | N=2 | N=5 | N=8 | N=10 |
|---|---|---|---|---|
| $4F^2$ | $2F^2$ | $0.8 F^2$ | $0.5 F^2$ | $0.4 F^2$ |

Table 1

FIG.19

HIGH CAPACITY LOW COST MULTI-STACKED CROSS-LINE MAGNETIC MEMORY

CROSS REFERENCE TO RELATED APPLICATIONS

This application is a continuation of U.S. patent application Ser. No. 11/740,861, filed on Apr. 26, 2007, by Rajiv Yadav Ranjan, and entitled "A High Capacity Low Cost Multi-Stacked Cross-Line Magnetic Memory", which claims priority to a previously-filed U.S. Provisional Application No. 60/795,755, filed on Apr. 26, 2006 and entitled "High capacity low cost multi-stacked cross-line magnetic memory" and is a continuation-in-part of U.S. patent application Ser. No. 11/674,124 entitled "Non-uniform Switching Based Non-Volatile Magnetic Base Memory", filed on Feb. 12, 2007 and a continuation-in-part of U.S. patent application Ser. No. 11/678,515 entitled "A High Capacity Low Cost Multi-State Magnetic Memory", filed on Feb. 23, 2007, and a continuation-in-part of U.S. patent application Ser. No. 11/739,648 entitled "Non-Volatile Magnetic Memory With Low Switching Current And High Thermal Stability", filed on Apr. 24, 2007 the disclosures of which are incorporated herein by reference, as though set forth in full.

BACKGROUND OF THE INVENTION

1. Field of the Invention

The present invention relates generally to non-volatile magnetic memory and particularly to non-volatile magnetic memory using diode for addressing thereof.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (TO) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash would be extremely difficult to scale below 45 nanometers (nm). Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM memory in a system design. Design of different memory technology in a product adds to design complexity, time to market and increased costs. For example, in hand-held multi-media applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies, such as Ovanic Ram (or phase-change memory), Ferro-electric Ram(FeRAM), Magnetic Ram (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art memory structures including MRAMs is their cell or memory size being too large therefore not lending itself well to scalability. A typical design of such MRAMs uses one or more transistors for one memory cells that lead to nT-1 mem cell type design where n=1-6. This makes the cell size too large leading to issues of scalability and cost. Recently, current-induced magnetization switching (CIMS) is being explored as an alternative memory solution, and allegedly introduces a better way of building higher capacity MRAM type memory. But memories based on MRAM tend to have larger cell size ($16-24F^2$, where F is the minimum feature based on the lithography technology).

Therefore, in light of the foregoing, what is needed is a non-volatile magnetic memory element utilizing magnetic diodes for addressing memory cells, the memory cells capable of being stacked on top of each other (in the direction of the z-axis) enabling higher capacity, lower cost designs and scalability (independent of lithography limits).

SUMMARY OF THE INVENTION

To overcome the limitations in the prior art described above, and to overcome other limitations that will become apparent upon reading and understanding the present specification, the present invention discloses a method and a corresponding structure for a magnetic storage memory device that is based on current-induced-magnetization-switching having reduced switching current in the magnetic memory and high memory capacity.

Briefly, an embodiment of the present invention includes a stackable diode-addressable current-induced magnetization switching (CIMS) memory element including a magnetic tunnel junction (MTJ) and a diode formed on top of the MTJ for addressing the MTJ.

These and other objects and advantages of the present invention will no doubt become apparent to those skilled in the art after having read the following detailed description of the preferred embodiments illustrated in the several figures of the drawing.

DETAILED DESCRIPTION OF THE PREFERRED EMBODIMENT

In the following description of the embodiments, reference is made to the accompanying drawings that form a part hereof, and in which is shown by way of illustration of the specific embodiments in which the invention may be practiced. It is to be understood that other embodiments may be utilized because structural changes may be made without departing from the scope of the present invention. It should be noted that the figures discussed herein are not drawn to scale and thicknesses of lines are not indicative of actual sizes.

In an embodiment of the present invention, a diode-addressable current-induced magnetization switching (CIMS) memory element is disclosed. In one embodiment of the present invention, the memory element includes a magnetic tunnel junction (MTJ) on top of which is formed a diode for storing digital information. The memory element is stackable into arrays of memory elements in each stack and each stack separated by deposited dielectric and CMPed surface. In an embodiment of the present invention, a magnetic shielding layer magnetically isolates one stack of memory elements from other stacks.

Figure 1:
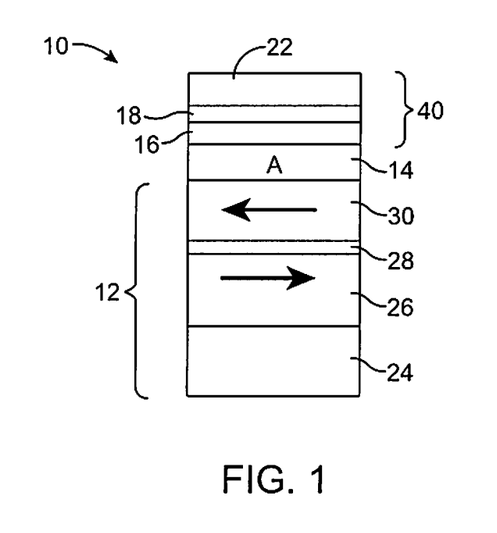
FIG. 1 shows relevant layers of a diode-addressable current-induced magnetization switching (CIMS) memory element 10, in accordance with an embodiment of the present invention.

Referring now to FIG. 1, relevant layers of a diode-addressable current-induced magnetization switching (CIMS) memory element 10 is shown, in accordance with an embodiment of the present invention. The memory element 10 is shown to include a magnetic tunnel junction (MTJ) 12 on top of which is formed a thin-flim diode 40 separated from the MTJ 12 by a conductive seeding silicon layer 14. The MTJ 12 is shown to include a pinning layer 24 on top of which is formed a fixed layer 26 on top of which is formed a tunnel layer 28 on top of which is formed a free layer 30. In one embodiment of the present invention, the diode 40 is a magnetic diode and in another embodiment of the present invention, the diode 40 is a Schottkey type of diode and in yet another embodiment of the present invention, the diode 40 is a silicon type of diode. In the case of the latter, in an exemplary embodiment, the layer 22 is made of n-type or p-type doped silicon using silicon nitride (SiN) or silicon phosphor (SiP) or silicon germanium (SiGe) or silicon boron(SiB) or any combination thereof.

It should be noted that the memory element 10, in various embodiments, may have a structure such as that disclosed in U.S. patent application Ser. No. 11/674,124 entitled "Non-uniform Switching Based Non-Volatile Magnetic Base Memory", filed on Feb. 12, 2007 or U.S. patent application Ser. No. 11/678,515 entitled "A High Capacity Low Cost Multi-State Magnetic Memory", filed on Feb. 23, 2007, or U.S. patent application Ser. No. 11/739,648 entitled "Non-volatile Magnetic Memory With Low Switching Current And High Thermal Stability", filed on Apr. 24, 2007, the disclosures of which are incorporated herein by reference, as though set forth in full.

The memory element of FIG. 1 includes a diode on top of a MTJ, as stated above. The layers 16, 18 and 22 each correspond to the thin-film diode where, in an exemplary embodiment, the layer is n-doped or p-doped silicon, the layer 18 is an oxide layer such as MgOx or AlOx and the layer 16 is a ferromagnetic layer such as CoFeB. Layers 24, 26, 28 and 30 of the MTJ correspond to the magnetic-tunnel junction. The layer 24 is the seed-layer and can also act as the bottom electrode layer, and can be made out of tantalum (Ta), in one embodiment of the present invention.

In one embodiment, the layer 24 may consist of a number of layers including an anti-ferromagnetic layer consisting of PtMn or IrMn. The layer 24 is used to create pinning for the fixed layer 26, which is the reason it is referred to as a pinning layer. The layer 26 is typically made of CoFeBPtX where the ratios of Fe, Co, Pt and B are varied to make sure that the resulting alloy has a substantially amorphous structure. Layer 28 is made of an oxide typically MgOx where x<=1. This may have a very thin layer of Mg, typically less than 5 Å, to get the proper crystalline structure of the MgOx layer which is required to get good tunneling property. Layer-4 can have a similar material properties and structure as layer 26 and is made of CoFeBPtX alloy. Layer 26 is the "fixed" layer, in that the magnetic orientation is locked in a predetermined orientation based on the induced magnetic anisotropy and the magnetic annealing of the anti-ferromagnetic layer. Layer-4 is the "free-layer" whose orientation would change based on the input-current. The two states of fixed versus free-layer being, parallel and anti-parallel, inducing different resistances, leading to "0" and "1" states.

The layer 14 is the base isolation layer on which the diode 40 is deposited. In an exemplary embodiment, the diode 40 has the structure of FM (ferro-magnetic)/oxide/N—Si where, the layer 16 is the n-doped Si, the layer 18 is the oxide layer selected from any of: MgOx, AlOx, or ZrOx, and the layer 22 is a ferromagnetic layer comprising of Co—Fe—B—Pt and acts as spin-injection layer. Although the embodiment shown in FIG. 1, shows magnetic moments being in-plane for the various layers, the magnetic moments can also be perpendicular to the plane of the memory element 10, which is especially useful for higher capacity memory. Also, the location of the diode 40 can be either on top or bottom of the MTJ 12, as will be shown in other embodiments, depending upon the relative location of "electrodes" as well as the bit lines and the word lines. The in-plane design has the memory elements having elongated, such as ellipsoid, type structure where the long axis is parallel to the "easy-axis" of the magnetic layers. The perpendicular designs have in-plane circular shape. This enables stacking the memory elements, made of the memory element 10, much closer together and thereby obtain much higher density of memory or storage capacity.

The MTJ 12 acts like a resistor therefore forming a resistor in series with the diode 40. The diode 40 is essentially used to address the memory element 10 for programming, erasing and/or reading operations. In operation, current is applied at memory element 10 in the direction that is favorable to the diode. The thin film diode may have different characteristics based on the structure of the memory element 10. In one embodiment of the present invention, the current flowing from the bottom up in FIG. 1 is the low resistance direction while the current flowing form the top-down is the extremely high resistance direction like the "reverse" direction of a pn junction.

The starting state of this magnetic memory is "parallel" state for the magnetic moments of layers 26 and 30. This is the "low resistance". When a current of say 300 micro-amp is applied from the bottom-up for memory element having a size of 100 nm*150 nm, the majority spins travel across the barrier while the minority "opposite" spin is reflected back into the free-layer 30 applying enough torque to the magnetic moments to flip in the opposite direction, as shown by the opposite arrows in FIG. 1. This is the high resistance state. In one embodiment the resistance of the "low resistance state" is between 400 to 600 ohms while the "high resistance state" is between 1000 to 1500 ohm.

Figure 2:
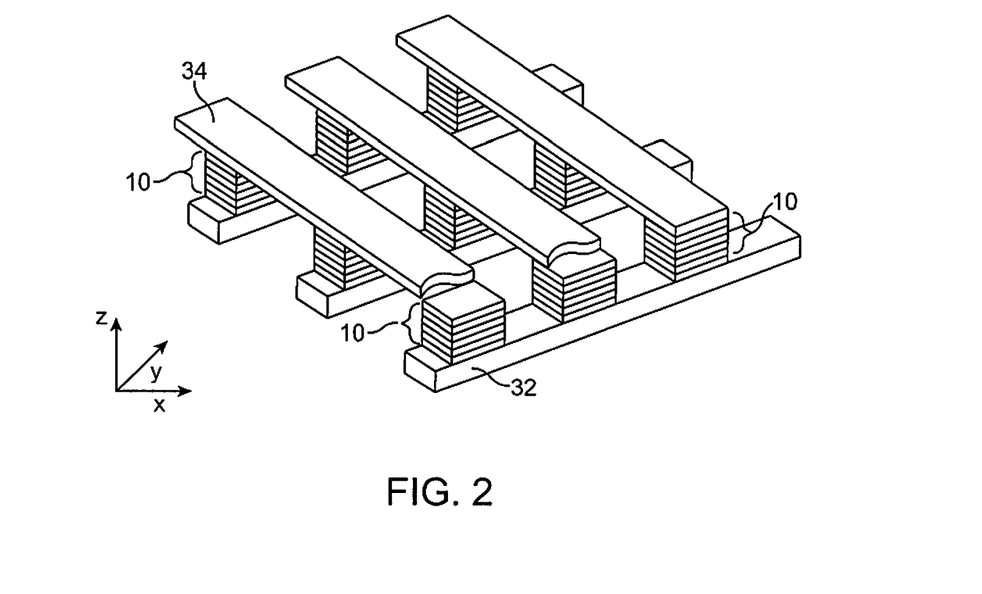
FIG. 2 shows a three-dimensional perspective view of an array of memory comprised of a multiple number of memory elements 10.

FIG. 2 shows a three-dimensional perspective view of an array of memory comprised of an array number of memory elements 10. The memory elements 10 are coupled using bit lines 32 and word lines 34 to form an array of memory elements. Another array of memory elements 10 may be stacked on top of the word line 34, in a direction of the z-axis and another set may be stacked on top of another word line and so on to form a three-dimensional or stack of memory elements made of the memory element 10 or any other memory element described or shown herein.

Figure 3:
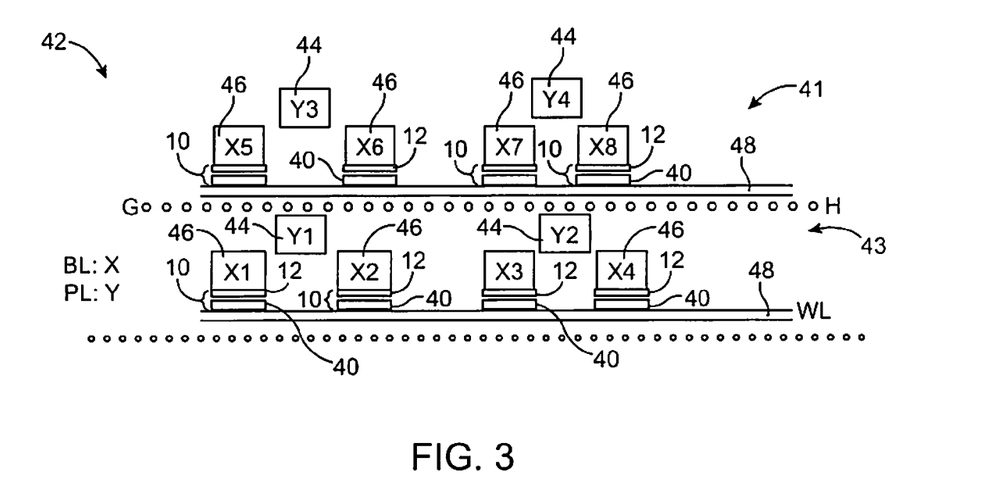
FIG. 3 shows a stack of CIMS memory elements 42, in accordance with an embodiment of the present invention.

FIG. 3 shows a stack of CIMS memory elements 42, in accordance with an embodiment of the present invention. The memory elements 42 are shown to include one stack of elements 41 stacked on top of another stack of elements 43 with each stack separated from the other by a CMPed surface 61. Each stack includes a number of memory elements, such as the memory element 10 of FIG. 1. As shown and discussed in FIG. 1, each memory element 10 includes a diode 40 and a MTJ 12 and similarly, each of the memory elements 10 of the stack of elements 41 also includes a diode 40 and a MTJ 12.

The diode 40 of each of the memory elements 10 of the stack of elements 41 is shown formed on top of the word line 48 and the diode 40 of each of the memory elements 10 of the stack of elements 43 and is also shown to be formed on the word line 48. The word lines for each stack of elements 41 and 43 are different, as are the bit lines 46 shown formed on top of the memory elements 10 for each element.

In FIG. 3, the program lines 44 are shown formed on top and between each two memory elements 10 and the bit lines 46 and the program lines 44 and the word lines 48 are essentially made of metal. By way of perspective, the bit lines 46 and the program lines 44 are wires going into the page. Erasing, as referred thereto at times, is achieved using the program lines 44.

Figure 4:
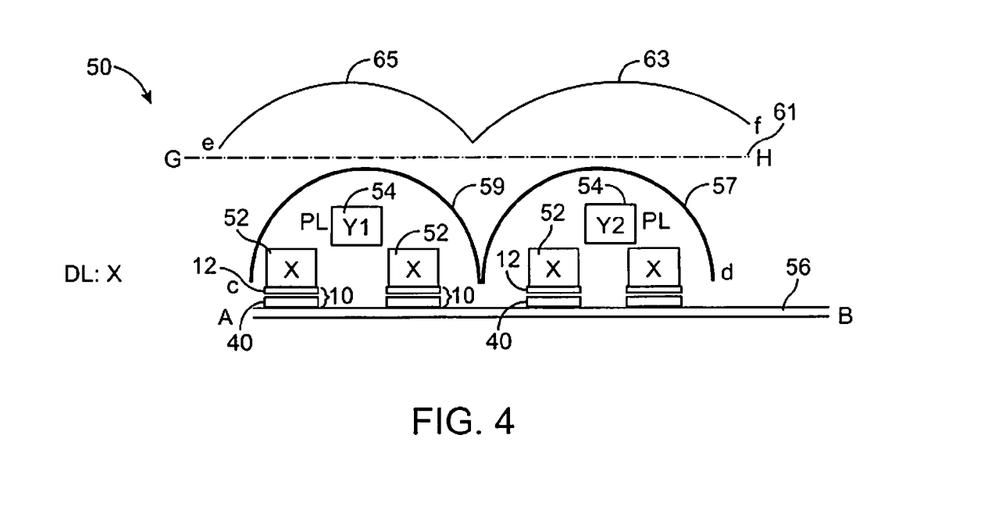
FIG. 4 shows a memory structure 50, in accordance with another embodiment of the present invention.

A magnetic shield 57 encompasses the top and sides of two of the bit lines and memory elements and program line, as shown in FIG. 4 and another magnetic shield 59 encompasses the top and sides of another two of the bit lines and memory elements and program line, as shown in FIG. 4. In an exemplary embodiment the magnetic shields 57 and 59 are made of a granular film comprising of a mixture of nano-particles of high permeability magnetic alloy such as conetic alloy in an oxide or nitride matrix where the oxide can be SiO2 or nitride can be SiN. These nano-particles of the high permeability magnetic alloy tend to almost super-paramagnetic and couple together in the presence of magnetic field such as that created during the erase operation using. It is very likely that a thin layer, 10-50 nm, of magnetic alloy may be deposited on top of the program line to focus the net magnetic field towards the memory element 10. This would lead to a lower erase current.

In the embodiment of FIG. 3, for each stack of elements 41 and 43 there is further shown erase lines 44 used for erasing of the memory elements 10. More specifically, the word line of a set of elements is excited thus activating a set of elements and then a bit line is excited to activate a particular memory element of the selected set of elements and a corresponding program line is used to program the activated or selected memory element to a particular value.

FIG. 3 shows the stacking of the memory elements 10, as previously noted. To build the embodiment of FIG. 3, as will be further described in additional figures later, the process includes using a CMOS process to form the decoder that would drive the word and bit lines at all stacked elements. The word lines are then formed on top thereof using aluminum (Al) or copper (Cu) or other types of metals. The memory elements are deposited with appropriate masking technique in each stack. The memory elements have the structure as described earlier. The bit lines are covered by a thin silicon nitride (SiNx) or silicon oxide layer overcoat. The erase lines Y1 and Y2 are then deposited. These are followed by further encapsulation using further deposition of SiNx or silicon oxide layer. A magnetic shielding layer, such as that shown in FIG. 4 is deposited and in an exemplary embodiment includes a mixture of oxides/nitrides such as SiO2, SiNx, ZrO2, . . . , with a soft-magnetic material having very high permeability such as the Conetic alloys of Ni—Fe—Cu—Mo (example being $Ni_{77}Fe_{14}Cu_4Mo_4$). A typical thickness of the magnetic shield layer is approximately less than 1 um. The main reason for magnetic shield layer is to keep the stray magnetic field from the erase lines 44 to be contained for bit lines 46.

The magnetic shielding layer, such as the layer 57 in FIG. 4, also protects the recoded bits from any disturbance from outside of the stray magnetic field, such as from other devices, whether applied intentionally or unintentionally. The magnetic shielding layer is followed by the deposition of SiNX or silicon-oxide layer to a thickness up to curves indicated at 63 and 65 or e-f, in FIG. 4. This is then followed by a CMP (chemical-mechanical polishing) layer to smooth surface thereof up to G-H in FIG. 3 or 61 in FIG. 4. G-H layer acts as the fresh layer on which additional word lines 48, memory elements 10, bit lines 46 and then the erase lines 44 are deposited. This sequence of formation can continue to add a number of memory layers leading to a 3-dimensional memory structure thereby increasing density and lowering costs. It should be noted that the relative positions of word lines and the bit lines can be interchanged depending on the memory cell design and the relative location of the diode with respect to the magnetic free-layer and the magnetic fixed-layer of the memory element.

Figure 5:
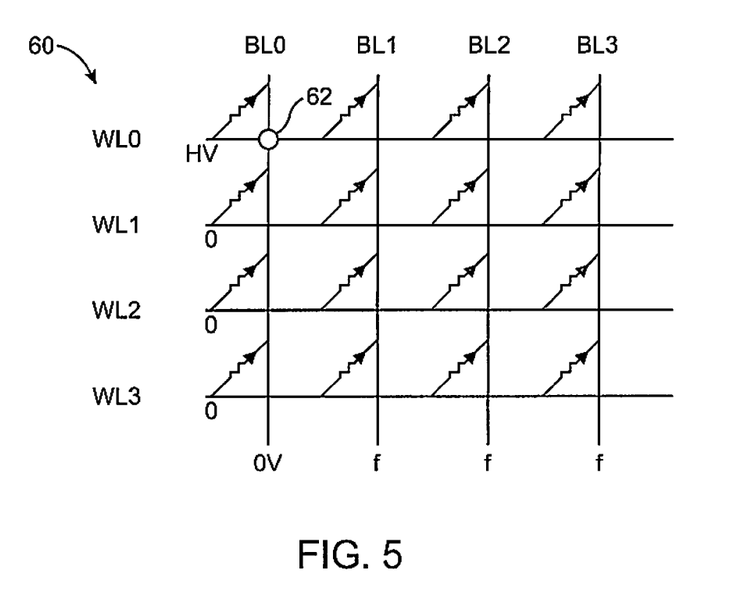
FIG. 5 shows a cross-lined memory structure 60 for addressing or selecting of bits therein made of the memory element 10 of FIG. 1, in accordance with an embodiment of the present invention.

One key aspect of the memory structures of the various embodiments herein is that the electrical current flows perpendicular to the memory-element 10, and provides the necessary torque to the magnetic-spins to cause current-induced magnetization switching, CIMS, leading to parallel and anti-parallel magnetic states of free versus pinned fixed layers. The memory architecture utilizes orthogonal word line and bit line architecture, as shown in FIG. 5. As will be further explained shortly, in one embodiment, as shown in FIG. 5, all the word lines are grounded except the one of concern, WL0 which is raised high. The corresponding bit-line BL0 is grounded during programming or connected sense amplifier during reading. Other bit-lines, BL1.BL3 are kept floating.

Figure 19:
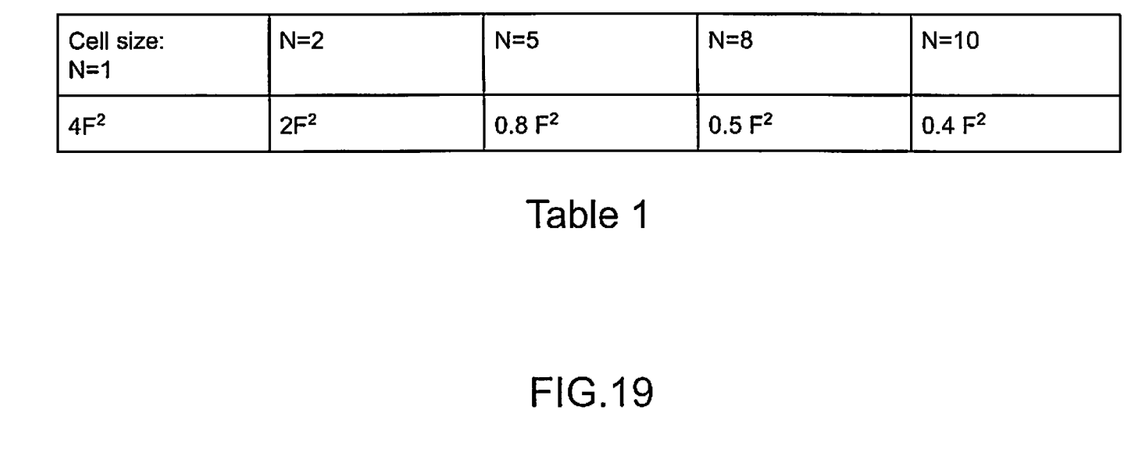
FIG. 19 shows in Table 1 the effect of number of stacks on the memory cell size in $F^2$

The cell-size of memory element 10, in an exemplary embodiment is: $4F^2/N$, where N corresponds to the number of memory layers which are stacked on top. As shown in FIG. 19, Table 1, as the number of stacks increase, the cell size decreases proportionately.

In accordance with FIG. 19, Table 1, for N=8, the cell size is $0.5F^2$, this is same as that of the current Hard-disk drives. Hard-disk drives are highest density storage device and thereby lowest cost. It is believed that in 3-5 years the hard-disk drive industry will employ patterned media to achieve higher areal density. The patterned media has a cell size of F2. Thus the N=8 and N=10 based memory per this invention is the smallest cell-size memory-storage device possible, leading to the lowest cost storage-memory.

FIG. 4 shows a memory structure 50, in accordance with another embodiment of the present invention. The structure 50 is shown to include a word line 56, essentially made of metal, bit lines 52 formed on top of the memory elements 10 and erase lines 54 shown positioned between two memory elements 10, much in the same manner as that shown with respect to the embodiment of FIG. 3.

In FIG. 4, the memory structure is similar to the memory structure 42 of FIG. 3 but shows further details in that a magnetic shielding layer 57 is shown to cover the top and sides of two of the bit lines and their respective memory elements 10 and a program line 54 and another magnetic shielding layer 59 is shown to cover the top and sides of two other bit lines and their respective memory elements 10 and a program line 54. The layers 57 and 59 serve to shield the magnetic-field of the program lines 54 and so as to prevent the magnetic field from going up and affecting the memory elements of stack 41 when the memory elements of stack 43 directly below is being erased. Further shown in FIG. 4, the layers 57 and 59 are CMPed up the surface 61 to smooth the layers 57 and 59. Also, the surface 65 and the surface 63 serve to indicate the dielectric surface of SiO2 or SiNx prior to being smoothened by the CMP process.

FIG. 5 shows a cross-lined memory structure 60 for addressing or selecting of bits therein made of the memory element 10 of FIG. 1, in accordance with an embodiment of the present invention. The structure 60 is a two-dimensional top view of the bit and word lines as shown in a 3-D view in FIG. 2. Bit lines BL0-BL3 are shown as vertical lines and generally made of metal or wires, as are word lines WL0-WL3 shown as horizontal lines crossing the bit lines BL0-BL3. While four bit lines and four word lines are shown to form the structure 60, any number of bit lines and/or word lines may be employed without departing from the scope and spirit of the present invention. At each of the crossings of a word line and a bit line, there exits a memory element and a diode, such as the memory element 10. Thus, an array of memory elements are formed at each of the crossings of the word lines WL0-WL3 with the bit lines BL0-BL3.

Typically and when not selecting any memory elements, the word lines are at a 0 V state. When a word line is driven to a positive (+) voltage, such as −1 volts (V), the word line selects the row of bit lines that it crosses and if a bit line is at a ground voltage, the memory element that is positioned at the crossing of the foregoing word and bit lines, is selected and is programmed. For example, in FIG. 5, a memory element at 62 is selected because the word line WL0 is driven to 1V and BL0 is driven to 0V thereby selecting the memory element positioned at the crossing of the WL0 and the BL0, for programming. During read operation the selected bit line BL0 is connected to sense amplifier which determines the cell is "0" or "1" based on the value of the MTJ resistance.

Figure 6:
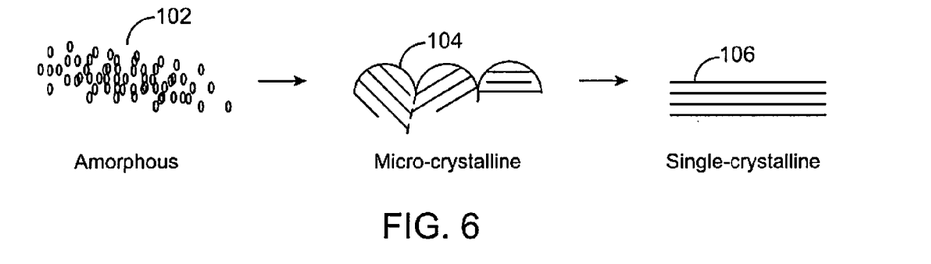
FIG. 6 shows the physical states of the diode 40 of the memory element 10, in accordance with an embodiment of the present invention.

FIG. 6 shows the physical states of the key thin-film silicon-layers of the diode 40 of the memory element 10 of FIG. 1. The silicon thin film used therein, in one embodiment of the present invention, has various crystal states. In FIG. 6, the silicon thin film is amorphous at 102 and when it is supplied with some external energy such as from a heat source, it becomes micro-crystalline, as shown at 104 and when further additional energy is supplied, it becomes a single-crystalline, as shown at 106.

While the energy source can be a heating source, such as a rapid thermal annealing process, in one embodiment of the present invention, during manufacturing the magnetic memory elements of the MTJ should not be affected by the processing of the diode of the memory element. In an exemplary technique for achieving the latter, three techniques are employed to ensure that the magnetic structure of the MTJ 12 is not impacted during the deposition of the thin-film diode 40 namely, (i) and to this end, a nucleating layer is used that is of less than 20 nano meters (nm) in thickness of one of more metals or their alloys chosen from the following material: Co, cobalt, Ni, nickel, Pt, platinum; (ii) deposition of these film using a PVD (physical deposition process) such as using rf- or dc-magnetron sputtering under typically a low argon pressure of less than 10 mili-torr and having less than 50 percent of H2 in the gas; (iii) having a pulsed laser source for heating such as using a Nd-YAG laser of peak power of less than 2 kw at 20 Khz. Laser annealing is typically carried out in the vacuum following the deposition of the silicon seeding layer 14, such as shown in FIG. 1. In an alternative embodiment, an additional isolation metal layer is used, of thickness of less than 100 nm and deposited to ensure heating during laser annealing, which remains focused on the seeding-Si layer 14.

Figure 7:
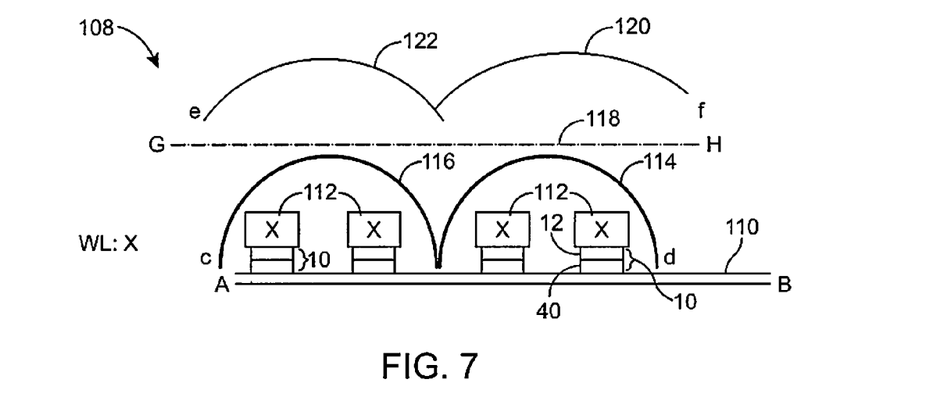
FIGS. 7 and 8 show two different examples of a one-time programmable memory, made of memory elements 10, in accordance with different embodiments of the present invention.
Figure 8:
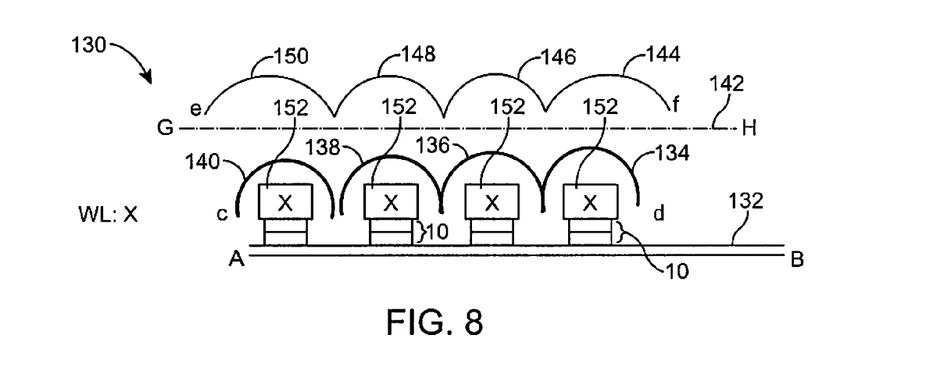

FIGS. 7 and 8 show two different examples of a one-time programmable memory, made of memory elements 10, in accordance with different embodiments of the present invention. In FIG. 8(a), a one-time programmable memory structure 108 is shown to include a word line 110 on top of which is shown formed a number of memory elements 10, each comprising a diode 40 and a MTJ 12 and on top of the memory elements 10 are shown formed bit lines 112, which are essentially made of metal extending into the page. Every two memory elements is surrounded, on top, by a magnetic shielding layer 114 and a magnetic shielding layer 116, which serve to magnetically shiled the bit lines 112. The layer 114 and layer 116 are chemically mechanically polished (CMPed) to a level indicated at 118 to smooth them. After CMP, a dielectric SiO2 or SiNx surfaces 120 and 122 become smoother to surface 118 marked as GH.

Additional stacks of such memory can be deposited on top of the smooth surface 118, as mentioned with respect to earlier embodiments. The memory elements 10 are programmed by passing current from the bottom thereof. The memory element, in the initial state, has both the layer 26 and the layer 30 having magnetization in the same direction as set by the magnetic annealing process. This is the "low-resistance" state. When a higher current, for example, 300 microamps, for a memory cell of size 90 nm×140 nm, is applied from the bottom of the memory element 10 for writing or programming (as compared to the read current of 50 microamps) spin-polarized electron having anti-parallel spins from the free layer are reflected back into the free layer 30 and switch the magnetic moment of the free layer into the antiparallel direction as shown by arrow in FIG. 1. This is the "high-resistance" state. Since the memory elements cannot be re-programmed and are accordingly referred to as one-time programmable memory.

In FIG. 8, a one-time programmable memory structure 130 is shown to include a word line 132 on top of which is shown formed a number of memory elements 10, each comprising a diode 40 and a MTJ 12 and on top of the memory elements 10 are shown formed bit lines 152, which are essentially made of metal extending into the page. Every memory elements is surrounded, on top, by a magnetic shielding layer 134, a magnetic shielding layer 136, a magnetic shielding layer 138 and a magnetic shielding layer 140, which are shields for magnetically shielding the memory element 10 from the top stacks as well as any unwanted or accidental magnetic field. The layer 144, 146, 148 and 150 are chemically mechanically polished (CMPed) to level or smooth them, such as shown at 142. The memory elements 10 are programmed by passing an up-programming current as explained earlier and cannot be re-programmed and are accordingly referred to as one-time programmable memory.

Figure 9:
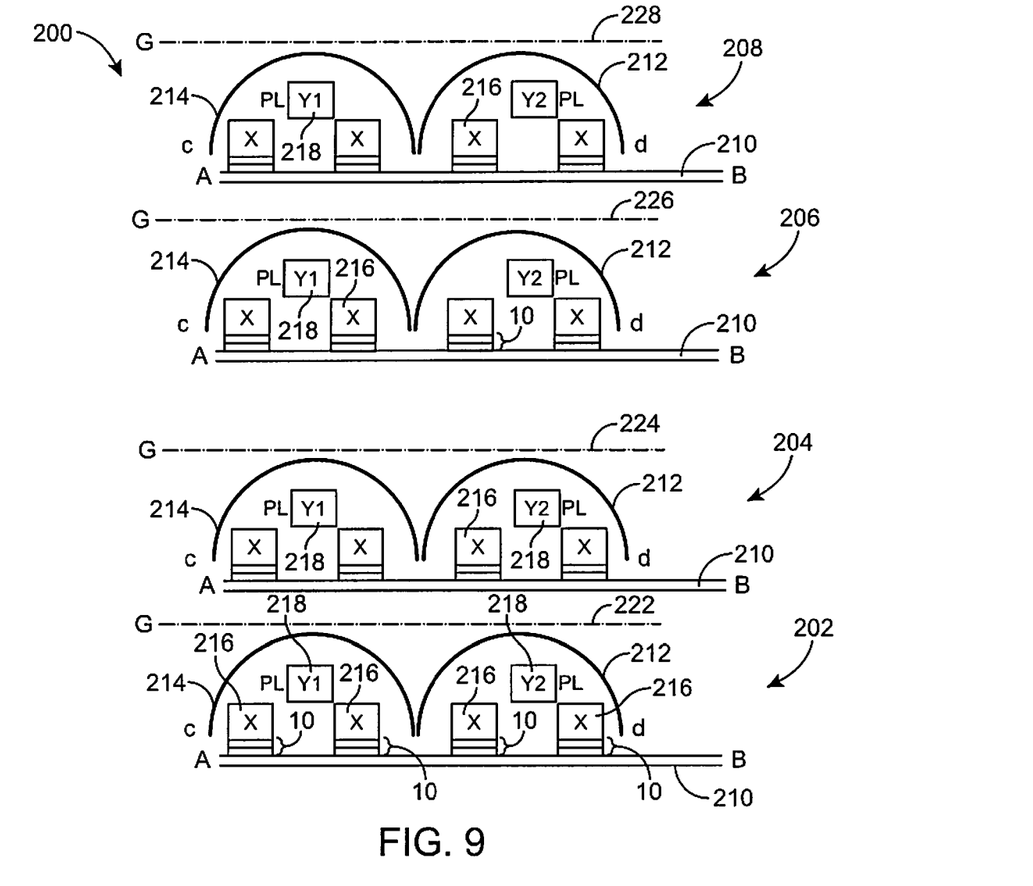
FIG. 9 shows a stacked memory structure 200 made of a number of memory elements 10, in accordance with an embodiment of the present invention.

FIG. 9 shows a stacked memory structure 200 made of a number of memory elements 10, in accordance with an embodiment of the present invention. The structure 200 includes four stacks of memory elements, a stack 202 on top of which is shown formed the stack 204 on top of which is shown formed the stack 206 and on top of which is shown formed the stack 208. Each of the stacks 202-208 are shown to include four memory elements 10 and two magnetic-shield surfaces 212 and 214. The memory elements are shown formed on top of a word line 210 in each stack and on top of each of the memory elements 10 is shown formed a bit line 216. In between and above each two memory elements 10 is shown formed an erase line 218. The word line, bit line and-erase lines are made of metal and the bit line 216 and the program line 218 are formed going into the page.

Each of two memory elements above which is formed the erase line 218 has a magnetic-shield layer 212 or a formed on top and around the erase line 218 and the memory elements 10 and above the magnetic-shield layers 212 and 214 are smoothed or flattened using a CMP process so that an adjacent stack may be formed there on top.

Figure 10:
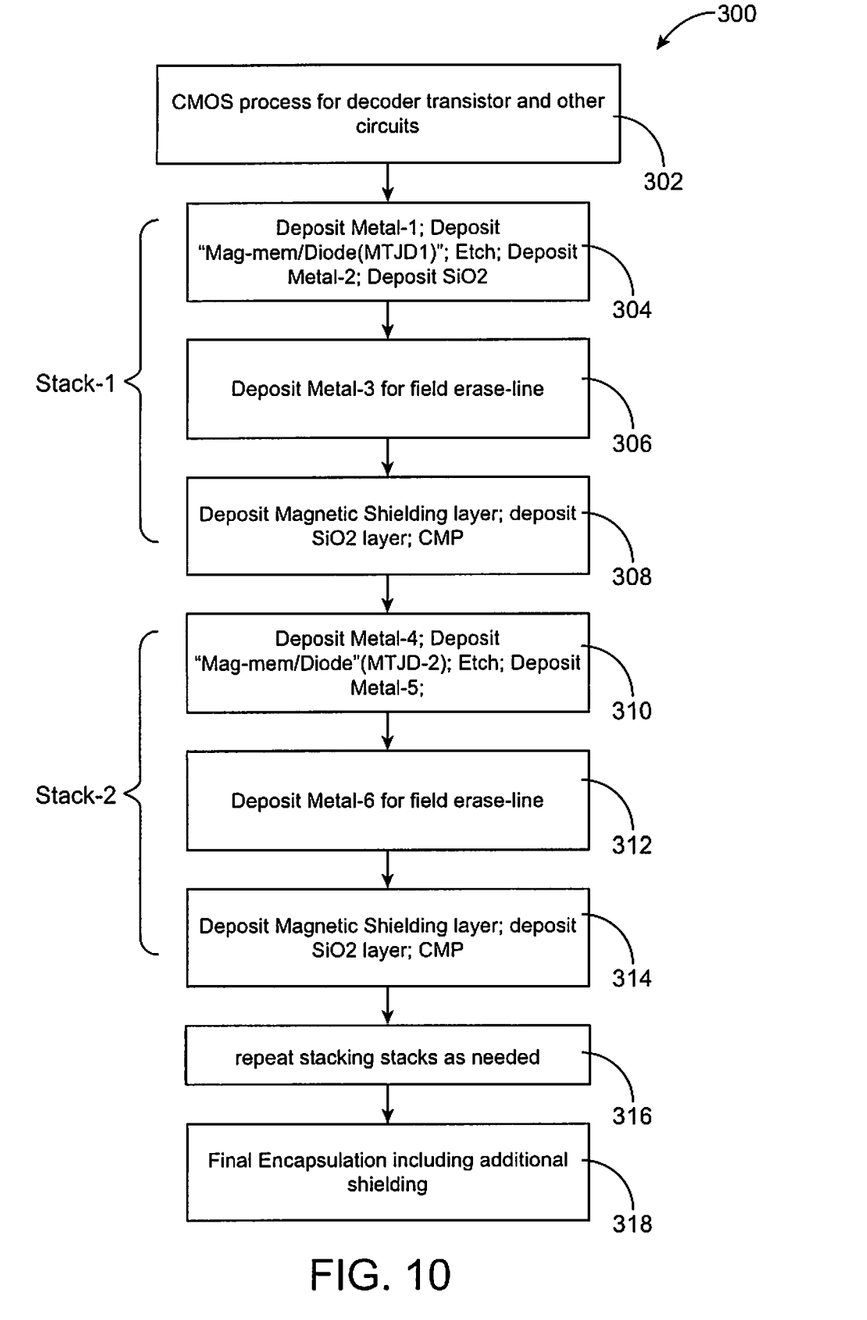
FIG. 10 shows a flow chart 300 of relevant steps performed in manufacturing the stack of memory elements, such as the stack 200 of FIG. 9.

FIG. 10 shows a flow chart 300 of relevant steps performed in manufacturing the stack of memory elements, such as the stack 200 of FIG. 9. In FIG. 9, at step 302, a CMOS process is performed to form the decoder transistor and other circuitry (collectively referred to as the "CMOS circuitry") used in conjunction with the stack of elements. Next, at step 304, a metal-1 layer is deposited on top of the CMOS circuitry and the MTJ and diode of the memory element 10 are deposited on top of the metal-1 and an etching process is performed after which a metal-2 layer is deposited followed by the deposition of a silicon dioxide (SiO2) layer.

Next, at step 306, a metal-3 layer is deposited on top of the deposited SiO2 layer forming a field erase or erase line, such as the lines 218 or 54 or others. Next, at step 308, a magnetic shielding layer is deposited on top of the deposited program line. The magnetic shielding layer is similar to the shielding layers 116, 136, 138 or the like. Also, at step 308, a SiO2 layer is deposited on top of the deposited magnetic shielding layer and CMP is performed. After the completion of the step 308, the first stack of memory elements is formed. Namely, steps 304-308 comprise the steps performed for manufacturing the first stack, such as the stack 202. Next, a second stack is formed on top of the first stack by performing the steps 310-314.

At step 310, a metal-4 layer is deposited and a second MTJ and diode comprising a second memory element is deposited on top of the metal-4 layer and an etching process is performed and a metal-5 layer is deposited.

Next, at step 312, a metal-6 layer is deposited on top of the metal-5 layer to form a second program line and thereafter, at step 314, a second magnetic shielding layer is deposited on top of the deposited metal-6 layer and a second SiO2 layer is deposited and CMP is performed and the second stack of memory elements is formed. Next, at step 316, if additional stacks are needed, they are formed, sequentially, on top do the second stack in accordance with the steps discussed relative to the formation of the first and second stacks. At step 318 and after the formation of all requisite stacks, an encapsulation process is performed to further shield the stack of elements.

Figure 11:
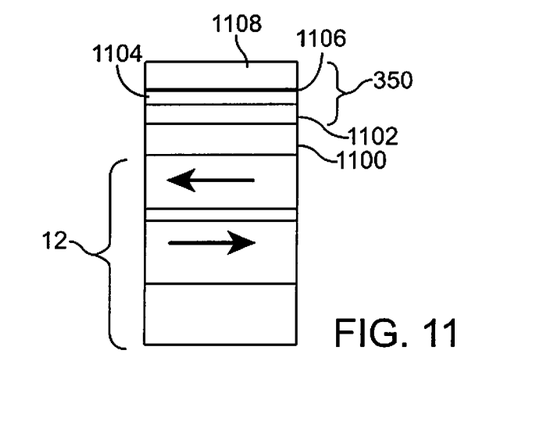
FIGS. 11 through 14 show different embodiments of the memory element 10.

FIGS. 11 through 14 show different embodiments of the memory element 10. FIG. 11 shows the MTJ 12 formed with a magnetic diode 350 on top thereof. The magnetic diode 350 is shown to include an isolation layer 1100, such as tantalum (Ta), on top of which is shown formed a silicon seeding layer 1102 for getting the primarily single crystalline Si layer thereon, one or more Si-doped layers 1104 shown formed on top of the layer 1102 and on top of the layer 1104 is shown formed a barrier tunneling layer 1106, on top of which is shown formed a metallic magnetic layer 1108.

Figure 12:
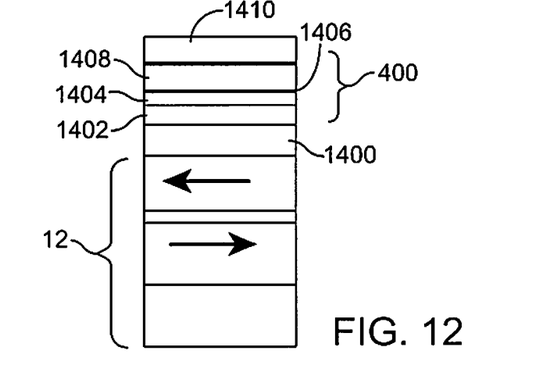

FIG. 12 shows the MTJ 12 formed with a non-magnetic diode 400 on top thereof. The magnetic diode 400 is shown to include an isolation layer 1400, in an exemplary embodiment made of Ta, a silicon (Si) seeding layer 1402 formed on top of the layer 1400 for getting the primarily single-crystalline Si layer thereon, one or more Si-doped layers 1404, 1406 and 1408 on top of which is shown formed a metallic non-magnetic layer 1410.

Figure 13:
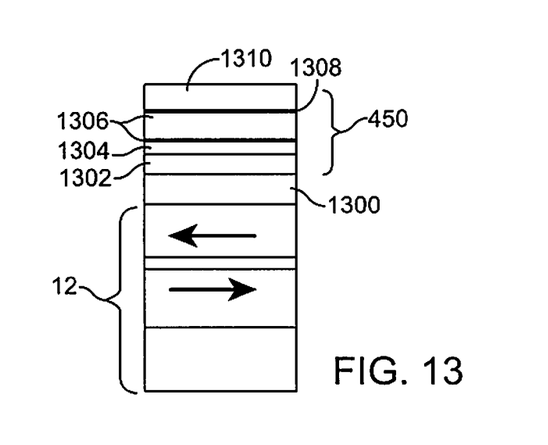

FIG. 13 shows the MTJ 12 formed with a magnetic diode 450 on top thereof. The thin film diode 450 is shown to include the layer isolation layer 1300, which in one embodiment is made of Ta, a Si-seeding layer 1302 formed on top of the layer 1300 for getting the primarily single-crystalline Si layer thereon, one or more Si-doped layers 1304-1308 following by metallic non-magnetic layer 1310. This diode could be a Schottky diode having low breakdown voltage for reverse biasing. In such case the memory design would not require the erase line or combination of the two could be used to erase the programmable stacked-memory.

Figure 14:
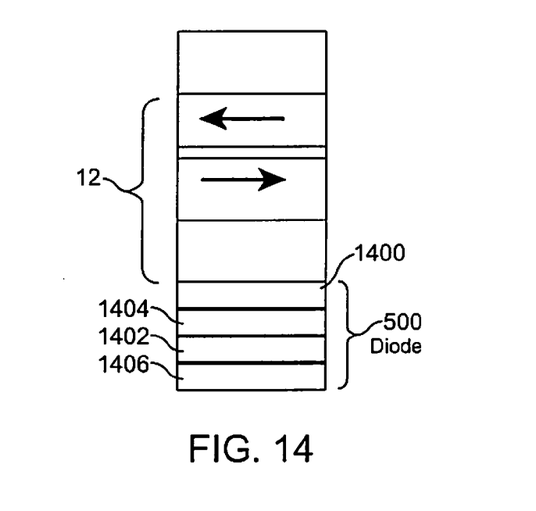

FIG. 14 shows the MTJ 12 formed with a magnetic diode 500 on top thereof. The magnetic diode 500 includes metallic non-magnetic layer 1406 on top of which is formed a Si-seeding layer 1402 on top of which is formed one or more Si-doped layers 1404 on top of which is formed an isolation layer 1400. The order of the formation of the layers may be altered to change the position of the free layer, for example. This diode 500 may be a Schottky diode having low breakdown voltage for reverse biasing. In such a case, the memory element design would not require the erase line or combination of the two could be used to erase the programmable stacked-memory.

Figure 15:
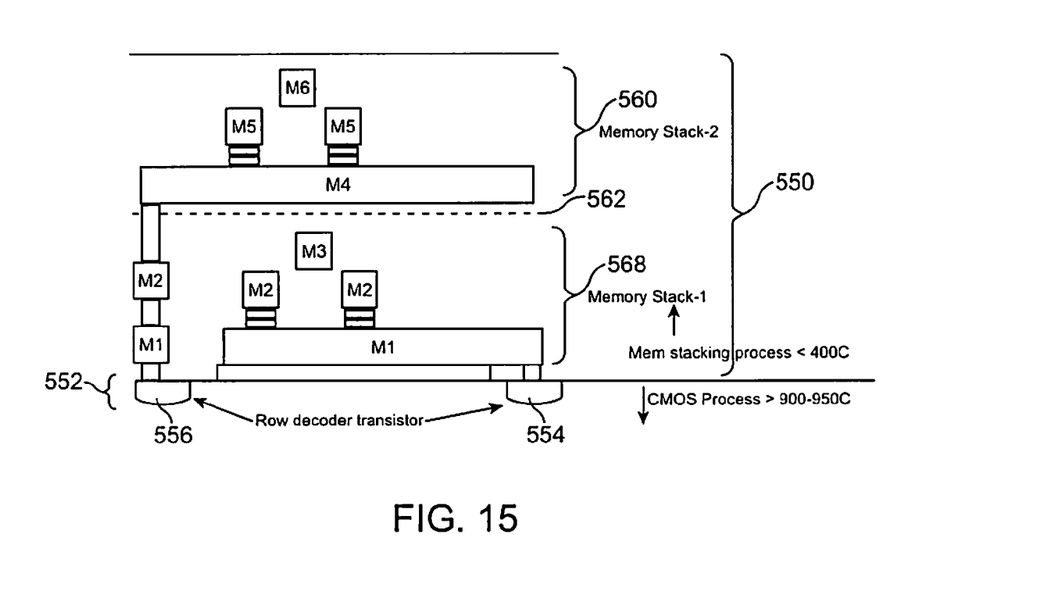
FIG. 15 shows a stack of memory 550 including a first stack 558 on top of which is formed a second stack 560

FIG. 15 shows a stack of memory 550 including a first stack 558 on top of which is formed a second stack 560, which is separated from the first stack by a dielectric layer having magnetic shielding layer embedded in the manners described earlier which are smoothened by the CMP process to provide a smooth surface 562. The stack of memory 550 is shown formed on top of CMOS circuitry 552, which is shown to include row decoder transistors 554 and 556 and may include other CMOS circuitry. The stack of memory 550 is shown to include the metal layers and memory elements previously discussed relative to other figures. In FIG. 15, the process for manufacturing the stack of memory versus the CMOS circuitry is noteworthy.

The stack of memory 550 is manufactured using overall temperatures of less than 400 degrees Celsius while the CMOS circuitry 552 is manufactured using temperatures greater than 900 to 950 degrees Celsius. The lower temperature for manufacturing the stack of memory is important in that it allows the amorphous state of the diode to transform to a crystalline state, as noted with respect to FIG. 7. As mentioned earlier with respect to FIG. 7, a laser anneal process may be employed but such process involves heating a very thin layer of the film typically less than 100 nm, and does not raise the temperature of the surrounding materials to any where close to 400 degree C.

Figure 16:
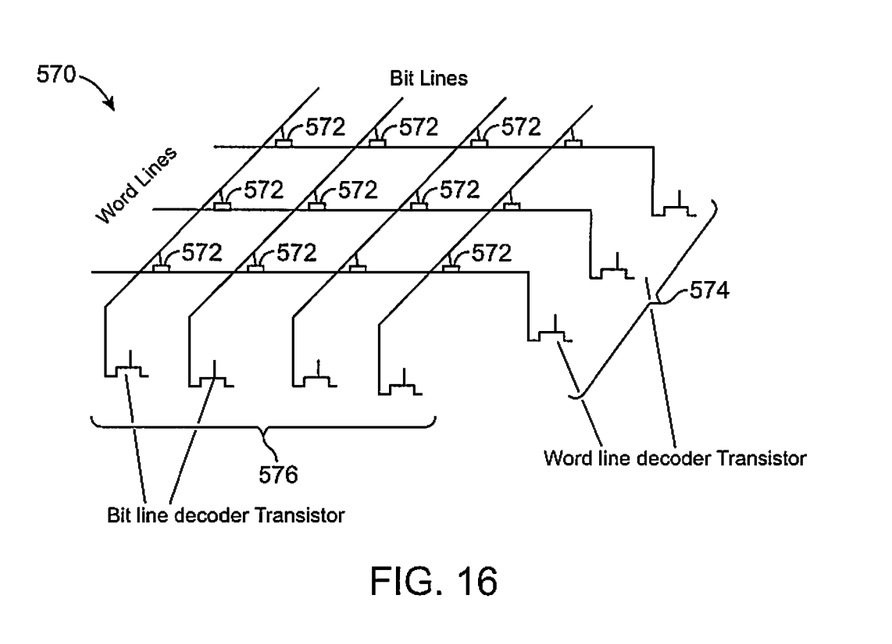
FIG. 16 shows a three dimensional perspective view of a memory structure 570 including an array of memory elements 572 and multiple word line decoder transistors 574 and multiple bit line decoder transistors 576.

FIG. 16 shows a three dimensional perspective view of a memory structure 570 including an array of memory elements 572 and multiple word line decoder transistors 574 and multiple bit line decoder transistors 576. The transistors 574 and 576 are CMOS circuitry, which are accordingly manufactured pursuant to the techniques shown and discussed relative to FIG. 15. The memory elements 572 are each similar to memory element 10. The memory element transistors 576 are shown coupled to bit lines with each of the transistors 576 being coupled to one bit and the transistors 574 are shown coupled to the word lines with each of the transistors 574 being coupled to a word line. Selection of a memory element 572 is made by activating a particular one of the transistors 576 and a particular one of the transistors 574, in a manner similar to previously-presented discussions regarding the same. The decoder for all stack layers is located in the silicon substrate. One bit of extra address causes the decoder to select another stack of memories.

Figure 17:
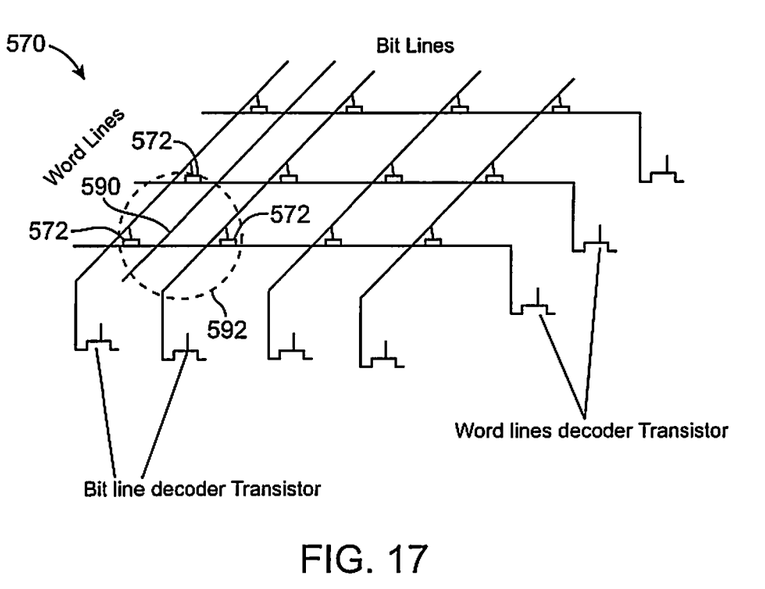
FIG. 17 shows the memory structure 570 of FIG. 16 with the addition of an erase or program line 590 shown between two of the bit lines.

FIG. 17 shows the memory structure 570 of FIG. 16 with the addition of an erase or program line 590 shown between two of the bit lines. During an erase operation, as the erase line 590, previously indicated, is activated, a magnetic field at 592 is generated to erase the neighboring memory elements to reset in the "parallel" magnetic moment or "low-resistance" state.

Figure 18:
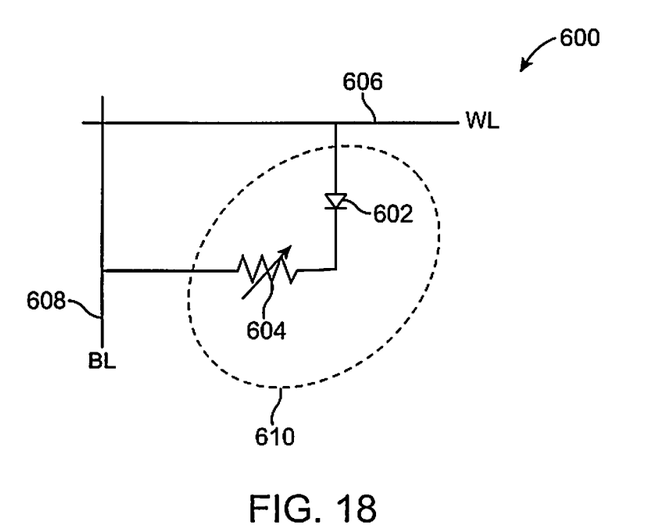
FIG. 18 shows a representation 600 of the behavior of the memory element 10 or 572 with respect to the word line 606 and the bit line 608.

FIG. 18 shows a representation 600 of the behavior of the memory element 10 or 572 with respect to the word line 606 and the bit line 608, which form a memory cell. The memory element 610 is shown to be coupled to the word line 606 and the bit line 608. More specifically, the memory element 610 is shown to include a variable resistor 604 modeling the MTJ 12 of FIG. 1 and a diode 602, modeling the diode 40 of FIG. 1, coupled to one another and the diode 602, also coupled to the word line 606. The resistor 604 is shown also to be coupled to the bit line 608. In operation, when current is applied to and passes through the forward, low-resistance direction, to cause writing of the memory cell to "anti-parallel" direction. The memory cell starts out with "parallel" state which is the low resistance state. The reading is carried out passing a low current such as less than 50 micro-amp in the forward direction of the diode. In contrast the writing current could be as high as 500 micro-amp depending on the structure of the MTJ as shown in FIG. 1. If the diode is a Schottky type diode having low breakdown voltage in the reverse direction then an opposite current of certain threshold can be applied to cause the erase operation instead of the erase-line 590 in FIG. 18.

It should be noted that the objects of the drawings or figures discussed and presented herein are not necessarily drawn to scale. Additionally, the relative locations of the MTJ as well as the layers of MTJs such as the fixed and the free-layers can be adjusted based on the type of the diode and its characteristic in the forward and reverse direction.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of manufacturing a diode-addressable current-induced magnetization switching (CIMS) memory element comprising:
   Forming decoder transistors on a CMOS substrate;
   Depositing a first metal layer on top of the decoder transistors;
   Depositing a magnetic tunnel junction (MTJ) on the first metal layer, etching, depositing a second metal layer on top of the first metal layer and depositing silicon oxide on the etched second metal layer;
   Depositing a third metal layer on top of the silicon oxide to form an erase line;
   Depositing a magnetic shielding layer to form a first stack; forming a second stack on top of the first stack.

2. The method of manufacturing, a recited in claim 1, wherein the depositing the magnetic shielding layer step including depositing a second silicon oxide on top of the magnetic shielding layer.

3. The method of manufacturing, a recited in claim 2, wherein the depositing the magnetic shielding layer step including chemical mechanical polishing prior to forming the second stack.

4. The method of manufacturing, a recited in claim 1, wherein the forming a second stack step including depositing a fourth metal and forming a diode on top of the fourth metal.

5. The method of manufacturing, a recited in claim 4, wherein the forming a second stack step including forming a diode on top of the fourth metal and etching.

6. The method of manufacturing, a recited in claim 5, wherein the forming a second stack step including depositing a fifth metal layer on top of the etched diode.

7. The method of manufacturing, a recited in claim 6, further including depositing a field erase-line on top of the fifth metal.

8. The method of manufacturing, a recited in claim 7, further including depositing a second magnetic shielding layer on top of the field erase-line.

9. The method of manufacturing, as recited in claim 8, further including depositing a third silicon oxide layer and chemical mechanical polishing.

* * * * *